(12) United States Patent
Otremba (10) Patent No.: US 7,443,014 B2
(45) Date of Patent: Oct. 28, 2008

(54) ELECTRONIC MODULE AND METHOD OF ASSEMBLING THE SAME

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 466 days.

(21) Appl. No.: 11/257,403

(22) Filed: Oct. 25, 2005

(65) Prior Publication Data
US 2007/0090496 A1 Apr. 26, 2007

(51) Int. Cl.
H01L 23/495 (2006.01)
(52) U.S. Cl. ............... 257/676; 257/686; 257/E23.044; 257/E23.052
(58) Field of Classification Search ................ 257/676, 257/686, E23.044, E23.052
See application file for complete search history.

(56) References Cited
U.S. PATENT DOCUMENTS
6,144,093 A 11/2000 Davis et al.
6,404,050 B2 * 6/2002 Davis et al. ................ 257/724
7,195,952 B2 * 3/2007 Vinn et al. ................. 438/108
2002/0113247 A1 * 8/2002 Magri et al. ............... 257/133
2004/0169262 A1 * 9/2004 Oliver et al. .............. 257/676

* cited by examiner

Primary Examiner—Trung Dang
(74) Attorney, Agent, or Firm—Edell, Shapiro & Finnan, LLC (57) ABSTRACT

An electronic module includes a semiconductor power switch and a semiconductor diode. The lower side of the semiconductor power switch includes an output contact mounted on a die pad of a leadframe, and the upper side of the semiconductor power switch includes a control contact and an input contact. The anode contact of the semiconductor diode is disposed on and electrically connected to the input contact of the semiconductor power switch. The cathode contact of the diode is electrically connected with the output contact of the power semiconductor switch.

34 Claims, 3 Drawing Sheets

ELECTRONIC MODULE AND METHOD OF ASSEMBLING THE SAME

FIELD OF THE INVENTION

The invention relates to electronic modules, in particular to modules including at least one semiconductor power switch and at least one semiconductor diode, and to methods of assembling electronic modules.

BACKGROUND

Electronic circuits such as those used in switched mode applications and in control circuits for DC motors typically require a number of different semiconductor components such as transistor devices and semiconductor diodes. The circuit is typically provided by one or more electronic modules, each module typically including a number of devices. A number devices may be provided within a single module in various ways.

In one approach, a single semiconductor body is provided which includes both transistor structures and semiconductor diode structures. This arrangement has the advantage that the space required by the circuit is reduced. However, the manufacture of the semiconductor body including two or more different types of device is expensive.

An alternative approach is to manufacture each type of device in a separate semiconductor die and provide a module which includes, for example, separate transistor dies and semiconductor diode dies within a single housing. Typically, two or more dies are mounted adjacent each other on a single die pad, as is known for example from U.S. Pat. No. 6,144,093, within the module. This approach has the advantage that cheaper manufacturing methods can be used to produce the different dies. However, this approach has the disadvantage that modules with two or more semiconductor components require additional electrical connections to electrically connect the different components. This increases the inductive load and inductive losses and causes switching losses.

Additionally, two or more die attachment processes are required to mount the dies next to each other on the die pad so that the assembly process is more complicated. The plurality of semiconductor components also requires a certain minimum area within the package housing not only due to the size of the components themselves, but also due to the space required by the two die attachment processes. The size to which the package housing of the module can be reduced is, therefore, limited.

It is, therefore, desired to provide an electronic module in which two or more semiconductor components can be more efficiently accommodated and which can be cost-effectively assembled.

SUMMARY OF THE INVENTION

An electronic module, according to an exemplary embodiment of the invention, comprises a leadframe, a semiconductor power switch, a semiconductor diode, and electrically insulating plastic encapsulation material. The leadframe comprises a die pad and a plurality of leads. Each lead has an inner portion and an outer portion. At least one lead extends from the die pad, providing an output lead, and the remaining leads are spaced at a distance from the die pad and provide at least one input lead and a control lead.

The semiconductor power switch comprises an upper side and a lower side. The lower side of the semiconductor power switch comprises an output contact and is disposed on the die pad. A control contact and an input contact are disposed on the upper side of the semiconductor power switch.

The semiconductor diode comprises an upper side and a lower side. The upper side comprises a cathode contact, and the lower side comprises an anode contact. The anode contact is disposed on and electrically connected to the input contact of the semiconductor power switch, and the cathode contact is electrically connected to the output contact of the power semiconductor switch.

At least one first electrical conductor extends between and electrically connects the control contact of the semiconductor power switch and the control lead of the leadframe. At least one second electrical conductor extends between and electrically connects the input contact of the semiconductor power switch and the input lead of the leadframe.

The electrically insulating plastic material encapsulates at least the semiconductor diode, the semiconductor power switch, the first and second electrical conductor, and the inner portions of the leads.

In this description, "upper" and "lower" are used to define the side of the semiconductor diode and semiconductor power switch in relation to the leadframe of the module. "Lower" refers to the side which faces downwards towards the leadframe, and "upper" refers to the side which faces upwards away from the leadframe.

The electronic module includes at least one vertical semiconductor power switch and at least one vertical semiconductor diode. According to an exemplary embodiment of the invention, the module accommodates two semiconductor components by mounting the semiconductor diode on top of the semiconductor power switch to form a stack. Therefore, the lateral space required within the housing of the module is determined largely by the lateral size of the semiconductor power switch. Consequently, a given semiconductor power switch and semiconductor diode can be accommodated within a module that has a smaller package outline. Given the current demand for miniaturization of electronic modules, this is very advantageous. Alternatively, a larger semiconductor chip with a higher switching power may be accommodated within a particular package housing. A package of a certain size may then be provided with a higher power rating. This is advantageous for applications in which higher power is required within a pre-defined limited space.

In particular, in the electronic module according to the invention, the anode contact of the semiconductor diode is mounted on, and electrically connected to, the input contact of the semiconductor power switch.

The orientation of the semiconductor diode with respect to the die pad in modules according to the invention is in contrast to the conventional orientation of the semiconductor diode in modules in which the semiconductor diodes is mounted on the die pad laterally adjacent the semiconductor power switch. In conventional types of modules, the anode contact normally faces upwards away from the die pad, and the cathode contact faces towards the die pad and is mounted on, and electrically connected to, the die pad. The arrangement of the diode with respect to the die pad in the electronic module of the invention can be described as a flip-chip type arrangement.

In modules in which the diode is mounted directly on the die pad, the cathode contact is electrically connected to the output lead of the leadframe of the electronic module by the die attachment material. The cathode, therefore, comprises a material suitable for producing a mechanical bond and electrical connection by the die attachment material.

In contrast, in the electronic module according to an exemplary embodiment of the invention, the cathode contact of the diode is electrically connected to the die pad by an additional electrical connection such as a bond wire or a clip. In a particular embodiment, the cathode contact of the semiconductor diode may comprise a material that is suitable for wire bond connections. Alternatively, the cathode contact may comprise a further bonding layer that is suitable for providing a good bond to a wire bond or a clip. In another embodiment, the bonding layer comprises at least one of Ag, Ni and NiP. These material are suitable for providing reliable wire bonds.

These arrangements provide a more reliable electrical connection by enabling the use of a conventional wire bonder and also enables the cathode contact to be electrically connected to the leadframe in the same process step that electrical connections between the control contact and input contact of the semiconductor power switch are formed.

The arrangement of the semiconductor diode on the semiconductor power switch according to the invention has the additional advantage that the arrangement avoids the use of an additional electrical connection, such as a bond wire, between the input contact of the semiconductor switch and the anode contact of the semiconductor diode. The additional inductance associated with an additional bond wire is, therefore, avoided.

The arrangement of the semiconductor diode on the semiconductor power switch has the further advantage that only one die attachment process is required in the assembly of the module. A die attachment process is used to mounted the lower side of the semiconductor power switch on the die pad and electrically connect the output contact, disposed on the lower side of the semiconductor power switch, to the die pad and consequently the output lead of the leadframe.

In processes in which the semiconductor diode and the semiconductor power switch are mounted on a single die pad laterally next to one another, it has been observed that the solder used in the second die attach process may spill over and contaminate the semiconductor component that is already mounted on the die pad. Additionally, it has been observed that the two semiconductor components are not necessarily mounted parallel to the upper surface of the die pad as bridging of the two solder deposits causes the dies to tilt with respect to the upper surface of the die pad. This has the disadvantage that the wire bonding process is unreliable, as the contact surfaces disposed on the upper surfaces of the semiconductor diode and semiconductor power switch are positioned at an angle to the die pad. These problems are avoided by the stacked arrangement of the module according to the invention.

The electrically insulating plastic material encapsulates the semiconductor power switch, semiconductor diodes, electrical connector, and inner portions of the leads. The outer surfaces of the electrically insulating plastic material provide the outer surfaces of the package housing of the module. The electrically insulating plastic material may comprise an epoxy resin as is commonly used in the transfer molding of semiconductor packages.

The electrically insulating plastic material has the advantage that it provides the package housing and provides electrically insulation between the semiconductor power switch and the semiconductor diode. Undesired short circuits between the components of the module within the module housing are, therefore, avoided. The invention, therefore, provides a reliable module that can accommodate at least two semiconductor components within a smaller package outline.

In one embodiment, the anode contact of the semiconductor diode lies at a distance from the input contact of the semiconductor power switch such that the plastic encapsulation material provides a voltage of between 500 V and 5000 V between the cathode contact of the semiconductor diode and the input contact of the semiconductor power switch. This provides a sufficient electrical isolation between the cathode of the semiconductor diode and the input of the semiconductor power switch within the module and further improves the reliability of the module.

The anode contact of the diode further comprises a second bonding layer disposed on its surface. The bonding layer comprises material suitable for one or more types of bonding, for example soft solder or diffusion solder. In one embodiment, the bonding layer comprises diffusion solder and comprises one of AuSn, AgSn, and CuSn.

The anode contact of the semiconductor diode is mechanically and electrically connected to the input contact of the semiconductor power switch by one of soft solder, electrically conductive adhesive, and diffusion solder. The bond material may be chosen depending on the required or expected operating conditions of the module taking into account the ease of assembly and, therefore, module cost. The material of the anode contact and/or the material which comprises the outer surface of the anode contact of the semiconductor diode is chosen so as to provide a suitable surface for the type of desired bond. Advantageously, the bond is provided by a diffusion solder bond as diffusion solder bond is have a high thermal stability and a low electrical resistance.

The electronic module can further include an electrically conducting spacer which is disposed on the anode contact of the semiconductor diode. The electrically conducting spacer has a thickness and a lateral size which spaces the anode contact disposed on the lower surface of the semiconductor diode from the input contact disposed on the upper surface of the semiconductor power switch by a distance. In this embodiment, the anode contact of the semiconductor diode includes a raised front side metallization structure which provides an electrically conductive spacer.

An additional electrically conductive spacer or raised front side metallization has the advantage that the distance between the semiconductor diode, and in particular, the anode contact and cathode contact of the semiconductor diode, and the input contact of the semiconductor power switch is increased. The semiconductor diode, semiconductor power switch and electrically conductive spacer are encapsulated by the electrically insulating plastic material. Therefore, the thickness of plastic encapsulation material disposed between the semiconductor diode and upper surface of the semiconductor power switch is increased. This provides an increased electrical isolation between the semiconductor diode and the semiconductor power switch which further improves the reliability and performance of the module.

The electrically conductive spacer provides the electrical connection between the anode of the semiconductor diode and the input contact of the semiconductor power switch. The electrically conductive spacer is disposed directly on the anode contact of the semiconductor diode and is mechanically and electrically connected to the input contact of the semiconductor power switch by an additional electrically conductive bond which is disposed at the interface between the anode contact of the diode and the input contact of the semiconductor power switch.

This configuration has the advantage that the electrically conductive spacer is more reliably positioned in the region in which it is desired as the semiconductor diode, typically, is laterally smaller than the semiconductor power switch and, in particular, the lateral area of the anode contact of the semiconductor diode fits within the lateral area of the input contact of the semiconductor power switch.

The electrically conductive spacer can have a thickness that positions the anode contact of the semiconductor diode at a distance from the input contact of the semiconductor power switch such that the plastic encapsulation material disposed in the gap formed between the anode contact and the input contact provides a voltage of between about 500 V and about 5000 V between the cathode contact of the semiconductor diode and the input contact of the semiconductor power switch. The plastic encapsulation material also provides sufficient electrical isolation between the edges of the semiconductor body of the semiconductor diode which surround the anode contact and the input contact of the semiconductor power switch. This further improves the reliability of the module as short circuits between leakage currents, which may arise at the edges or in the edge regions of the body of the semiconductor diode and the semiconductor power switch, are substantially prevented.

By way of a non-limiting example, the electrically conductive spacer can have a thickness of about 50 μm. This thickness provides a layer of plastic encapsulation material between the semiconductor diode and semiconductor power switch which provides a sufficient blocking voltage.

The electrically conductive spacer can be laterally smaller than the anode contact of the semiconductor diode so that the edge regions of the anode contact remain free from the electrically conductive spacer. The edge regions of the semiconductor diode are spaced at a distance from the input of the semiconductor power switch and are covered by the plastic encapsulation material. The edge regions of the semiconductor diode are electrically isolated from the semiconductor switch, and short circuits due to leakage currents which may arise in the edge regions of the diode may be more effectively avoided.

The electrically conductive spacer is mechanically and electrically connected to the input contact of the semiconductor power switch by one of soft solder, electrically conductive adhesive, and diffusion solder. The electrically conductive spacer may, therefore, comprise a material suitable for the desired bonding method. For example, the electrically conductive spacer may comprise a soft solder wettable material.

The electrically conductive spacer may also comprise an upper bonding layer of a material which is suitable for the desired bonding method. This has the advantage that the electrically conductive spacer may comprise a low resistance material which provides a good reliable bond to the material of the anode contact while providing an outer surface which can be reliably bonded to the semiconductor power switch. If a diffusion bond is desired between the electrically conductive spacer and the input contact of the semiconductor power switch, the materials of the interface are chosen so as to provide a diffusion solder bond at a desired bonding temperature which, after its production, has a desired thermal stability. The electrically conductive spacer may comprise an additional bonding layer of a diffusion solder such as AuSn, AgSn, or CuSn. This diffusion solders are particularly suitable for an input contact which comprises Cu.

The electrically conductive spacer may comprise a metal or an alloy and may comprise one or more of the elements copper, nickel and aluminum.

The first electrical conductor, which electrically connects the control contact of the semiconductor power switch and the control lead of the leadframe, may comprise one of a bond wire and a clip. The first electrical conductor may comprise a gold bond wire which may have diameter of 75 μm (micron).

The second electrical conductor, which electrically connects the input contact of the semiconductor power switch and the input lead of the leadframe, may also comprise one of a bond wire and a clip. The second electrical conductor may comprise an aluminum bond wire with a greater diameter, for example 350 μm, than that of the gold wire. A larger diameter wire is advantageous as the wire generally has to be capable of carrying relatively large currents. Aluminum has the advantage that it is cheaper than gold so that the materials costs may be reduced over the use of a gold wire for the second electrical conductor.

The cathode contact of the semiconductor diode may be electrically connected to the output lead of the leadframe by one of a bond wire and a clip. This electrical connection provides a module in which the semiconductor diode is electrically connected in parallel with the semiconductor power switch. The bond wire or clip may extend between the cathode contact and the die pad to between the cathode contact and the output lead depending on the space available and layout of the leadframe of the module. The cathode contact of the semiconductor diode is, therefore, electrically connected to the output contact of the semiconductor switch.

The semiconductor power switch can be a MOSFET device where the input contact is a source electrode, the output contact is a drain electrode, and the control contact is a gate electrode. The semiconductor power switch can also be a bipolar junction transistor (BJT) device where the input contact is an emitter electrode, the output contact is a collector electrode, and the control contact is a base electrode. The leads of the leadframe are correspondingly an emitter lead and a collector lead. The semiconductor power switch can also be an insulated gate bipolar transistor (IGBT) device where the input contact is an emitter electrode, the output contact is a collector electrode, and the control contact is a gate electrode. The leads of the leadframe are correspondingly an emitter lead and a collector lead.

The semiconductor diode can be one of a Schottky diode and a pin diode. The semiconductor diode is electrically connected in parallel with the semiconductor power switch. In a further embodiment, the module is configured so that the semiconductor diode is a free-wheeling diode.

The electronic module may have a package outline conforming to a JEDEC standard package outline. Package outline is used in this context to define the dimensions of the plastic housing of the module as well as the layout and size of the leadframe including the number of leads or pins and their lateral size and spacing. It is advantageous if the module has a package outline which conforms to a standard JEDEC package outline as the module can be more easily fitted onto existing circuit boards which conform to these standards.

The electronic module may, in a further embodiment of the invention, comprise a plurality of semiconductor power switches and a plurality of semiconductor diodes. The pluralities of semiconductor switches and semiconductor diodes may comprise one or more stacks, each stack including a semiconductor power switch and semiconductor diode with an arrangement according to one of the embodiments previously described. The one or more stacks may be configured and electrically coupled provide a module which performs a certain desired function. The one or more stacks may also be configured and electrically coupled with further electronic components to provide a module.

The plurality of semiconductor power switches and the plurality of diodes can be arranged to provide a plurality of stacks. Each stack comprising a diode and a semiconductor power switch in which the anode contact of the diode is mounted on and electrically connected to the input contact of the semiconductor power switch. The electronic module comprises a circuit having one of a half-bridge arrangement consisting of two stacks and a full-bridge arrangement consisting of four stacks, for example. The module may then be used to control a dc electric motor for example.

The invention also relates to modules which do not necessarily include a leadframe to provide the electrically connections between the semiconductor components and an external circuit carrier such as a printed circuit board. In particular, the module includes a leadframe structure which is application specific and does not conform to a standard package outline. This is advantageous, for example, if the module should be capable of fitting into a customer-designed board or subsystem module which has a non-standard layout.

An electronic module, according to this embodiment, comprises at least one semiconductor power switch and at least one semiconductor diode. The semiconductor power switch comprises an upper side and a lower side. A control contact and an input contact are disposed on the upper side of the semiconductor power switch and an output contact is disposed on the lower side of the semiconductor power switch.

The semiconductor diode comprises an upper side and a lower side. The upper side comprises a cathode contact and the lower side comprises an anode contact. The anode contact is disposed on and electrically connected to the input contact of the semiconductor power switch. The semiconductor diode is electrically connected in parallel with the semiconductor power switch.

The module further comprises an electrically insulating plastic material which encapsulates at least the semiconductor diode and the semiconductor power switch. The electrically insulating plastic material provides a voltage of between 500 V and 5000 V between the cathode contact of the semiconductor diode and the input contact of the semiconductor power switch.

The invention also provides an electronic module which includes one or more stacks according to one of the embodiments already described. One or more stacks may be part of an electrical circuit in which the stacks are coupled so as to provide known circuit elements such as a half-bridge arrangement or a full-bridge arrangement. The electronic control system may also comprise further electronic components such that the system has a desired functionality. For example, the electronic control system may be a control unit for a dc electric motor.

The invention also relates to methods of assembling an electronic module. A method of assembling an electronic module comprises providing at least one semiconductor power switch and providing at least one semiconductor diode.

The semiconductor power switch comprises an upper side and a lower side. A control contact and an input contact are disposed on the upper side of the semiconductor power switch, and an output contact is disposed on the lower side of the semiconductor power switch.

The semiconductor diode comprises an upper side and a lower side, wherein the upper side comprises a cathode contact and the lower side comprises an anode contact.

The semiconductor diode in mounted on the semiconductor power switch by attaching the anode contact of the semiconductor diode to, and electrically connecting the anode contact to, the input contact of the semiconductor power switch.

Electrical isolation between the cathode contact of the semiconductor diode and the input contact of the semiconductor power switch provides a voltage of between about 500V and about 5000V between the cathode contact of the semiconductor diode and the input contact of the semiconductor power switch.

This method provides an electronic module in which at least one stack of a semiconductor power switch and a semiconductor diode is provided. The stacked configuration reduces the lateral space required by the semiconductor components of the module. The semiconductor power switch and semiconductor diode are electrically connected in parallel so as to provide a module with a desired functionality. The module may comprise further electronic components to complete the circuit which has the desired function.

A reliable module is provided as the semiconductor switch and semiconductor diode are provided with appropriate electrical isolation by the plastic encapsulation material. The use of plastic encapsulation material to provide the electrical isolation has the advantage that it is simple and cost-effective to produce and can also provide the plastic housing of the module if this is desired.

The electrical isolation can be provided by the plastic encapsulation material. The anode is spaced at a distance from the input contact such that the plastic encapsulation material provides a voltage of between 500V and 5000V between the cathode contact of the semiconductor diode and the input contact of the semiconductor power switch.

The use of plastic encapsulation material to provide the electrical isolation has the advantage that it is simple and cost-effective to produce and can also provide the plastic housing of the module if this is desired. The distance between the anode contact of the semiconductor diode and the input contact of the semiconductor power switch may be varied in order to provide the desired blocking voltage between the cathode contact of the semiconductor diode and the input contact of the semiconductor switch depending on the electrical isolation properties of the plastic encapsulation material.

The semiconductor diode is electrically connected in parallel with the semiconductor power switch. This is achieved by provision of the appropriate electrical connections. The semiconductor diode can be configured within the module to provide a free-wheeling diode.

In a further embodiment, a plurality of semiconductor power switches and a plurality of semiconductor diodes are provided. At least one stack including a diode is disposed on a semiconductor power switch according to one of the embodiments described. The plurality of semiconductor power switches and the plurality of semiconductor diodes, including at least one stack, are configured in one of a half-bridge and a full-bridge arrangement. The half bridge or full bridge configuration includes at least one stack comprising a semiconductor power switch and semiconductor diode in which the anode contact of the semiconductor diode is disposed on and electrically connected to the input contact of the semiconductor power switch.

A method of assembling an electronic module according to the invention comprises providing a leadframe which comprises a die pad and a plurality of leads. Each lead has an inner portion and an outer portion. At least one lead extends from the die pad providing an output lead, and the remaining leads are spaced at a distance from the die pad and provide at least one input lead and a control lead.

At least one semiconductor power switch is provided which comprises an upper side and a lower side. A control contact and an input contact are disposed on the upper side of the semiconductor power switch and an output contact is disposed on the lower side of the semiconductor power switch.

The lower side of the semiconductor power switch is attached to the die pad, electrically connecting the output contact to the die pad and to the output lead of the leadframe.

A semiconductor diode is provided which comprises an upper side and a lower side. The upper side comprises a cathode contact and the lower side comprises an anode contact. The anode contact of the semiconductor diode is attached and electrically connected to the input contact of the semiconductor power switch.

The cathode contact of the semiconductor diode is electrically connected to the output lead of the leadframe, the control contact of the semiconductor power switch is electrically connected to the control lead of the leadframe and the input contact of the semiconductor power switch to the input lead.

At least the semiconductor diode, the semiconductor power switch, and inner portions of the leads are encapsulated in electrically insulating plastic material.

This method has the advantage that the module is provided with at least one stack of semiconductor components in which the anode contact of the semiconductor diode is electrically connected to the input contact of the semiconductor power switch by mounting the semiconductor diode on the input contact of the semiconductor power switch.

The leadframe may be provided in the form of a leadframe strip which comprises a plurality of device positions which are mechanically connected by tie bars. Each device position provides a leadframe for an electronic module. In this embodiment, at least one semiconductor power switch is mounted on the die pad of each device position and a semiconductor diode is attached to the upper side of the semiconductor power switch in each device position. The electrical connections between the cathode contact of the semiconductor diode, the input contact of the semiconductor power switch and the control contact of the semiconductor power switch and the respective portions of the leadframe are then produced. An encapsulation or molding process is then carried out for each device position, and the plurality of electronic modules is then separated from the leadframe strip.

The anode can be spaced at a distance from the input contact such that the plastic encapsulation material provides a voltage of between 500 V and 5000 V between the cathode contact of the semiconductor diode and the input contact of the semiconductor power switch. This provides a reliable electronic module as short circuits between the semiconductor diode and the semiconductor power switch are hindered.

In a further embodiment, an electrically conducting spacer is deposited on the anode of the semiconductor diode. The electrically conducting spacer has a thickness and a lateral size and spacing the anode contact from the input contact of the semiconductor switch by a distance. This provides a reliable method by which the spacing between the anode contact of the semiconductor diode and the input contact of the semiconductor power switch may be controlled.

The electrically conducting spacer may be deposited to a thickness of about 50 μm to provide the desired electrical isolation.

A further bonding layer may be deposited on the cathode contact of the diode before the diode is mounted on the semiconductor power switch.

The bonding layers provided on the anode contact and cathode contact in addition to the electrically conductive spacer layer, according to one of the embodiment of the invention, are advantageously deposited at the wafer level. In this embodiment, the desired front and rear side contact structures are provided for a plurality of diodes in the same process step. Manufacturing costs are, therefore, reduced.

The electrically conductive spacer can be laterally smaller than the anode of the semiconductor diode so that the edge regions of the anode remain free from the electrically conductive contact and are spaced at a distance from the input of the semiconductor switch and are covered by the plastic encapsulation material. This provides an effective electrical isolation between the edge regions of the semiconductor diode and the underlying semiconductor power switch so that short circuits caused by leakage currents at the sawed edges of the semiconductor diode can be avoided.

The electrically conductive spacer may be deposited on the anode contact of the semiconductor diode by galvanic techniques. Galvanic techniques have the advantage that the layer which provides the electrically conductive spacer may be relatively quickly deposited. Additionally, the materials usage is minimized in that only that material which is deposited on the anode contact is consumed from the materials source, in this case from the plating bath.

The anode contact of the semiconductor diode may be mounted on the input contact of the semiconductor power switch by one of soft soldering, diffusion soldering, and electrically conductive adhesive. These materials provide a layer resistance electrical contact and a reliable mechanical bond.

A further bonding layer may be deposited on the outer surface of the anode contact. The bonding layer may comprise electrically conductive adhesive, soft solder or diffusion solder.

If an electrically conductive spacer is provided on the anode contact of the semiconductor diode, the electrically conductive spacer is mounted on the input contact of the semiconductor power switch by one of soft soldering, diffusion soldering, and electrically conductive adhesive.

A further bonding layer may be deposited on the outer surface of the electrically conductive spacer. The bonding layer may comprise electrically conductive adhesive, soft solder, or diffusion solder.

The cathode contact of the semiconductor diode may be electrically connected to the output lead of the leadframe by one of a bond wire and a clip, the input contact of the semiconductor power switch may be electrically connected to the input lead by one of a bond wire and a clip and the control contact of the semiconductor power switch may electrically connected to the control lead of the leadframe by one of a bond wire and a clip.

In summary, the invention provides a stack of two semiconductor components in which a diode is mounted on a semiconductor power switch by an electrically conductive bond which is positioned directly between, and is in direct contact with, the anode contact of the diode and input contact of the semiconductor power switch. This stack may be accommodated on a single die pad of an electronic module to provide a module in which the diode is electrically connected in parallel with the semiconductor power switch.

This configuration provides a basic building block used in numerous electronic circuits. One or more stacks according to the invention can, therefore, be electrically connected as desired with other stacks or other electronic components so as to produce a desired circuit.

The stack has the advantage that the area required by the two components is reduced over modules in which the two components are mounted adjacent to one another. The invention also provides a reliable module as electrical isolation between the diode and power switch is provided by the plastic encapsulation material, such as epoxy resin, which also provides the package housing of the module. The electrical isolation can be varied according to that desired by varying the distance between the adjacent contact surfaces of the stack, in this case the anode contact of the diode and the input contact of the semiconductor power switch.

This can be provided by the use of an electrically conductive spacer or a raised front side metallization which is disposed directly on the anode contact of the diode. The outer surface, provided by either the anode contact or the electrically conductive spacer, is mechanically attached to and electrically connected to the input contact of the semiconductor power switch by an electrically conductive bonding layer. The bonding layer may cover substantially the whole of the anode contact so as to produce a mechanically stable stack and a low electrical resistance bond.

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
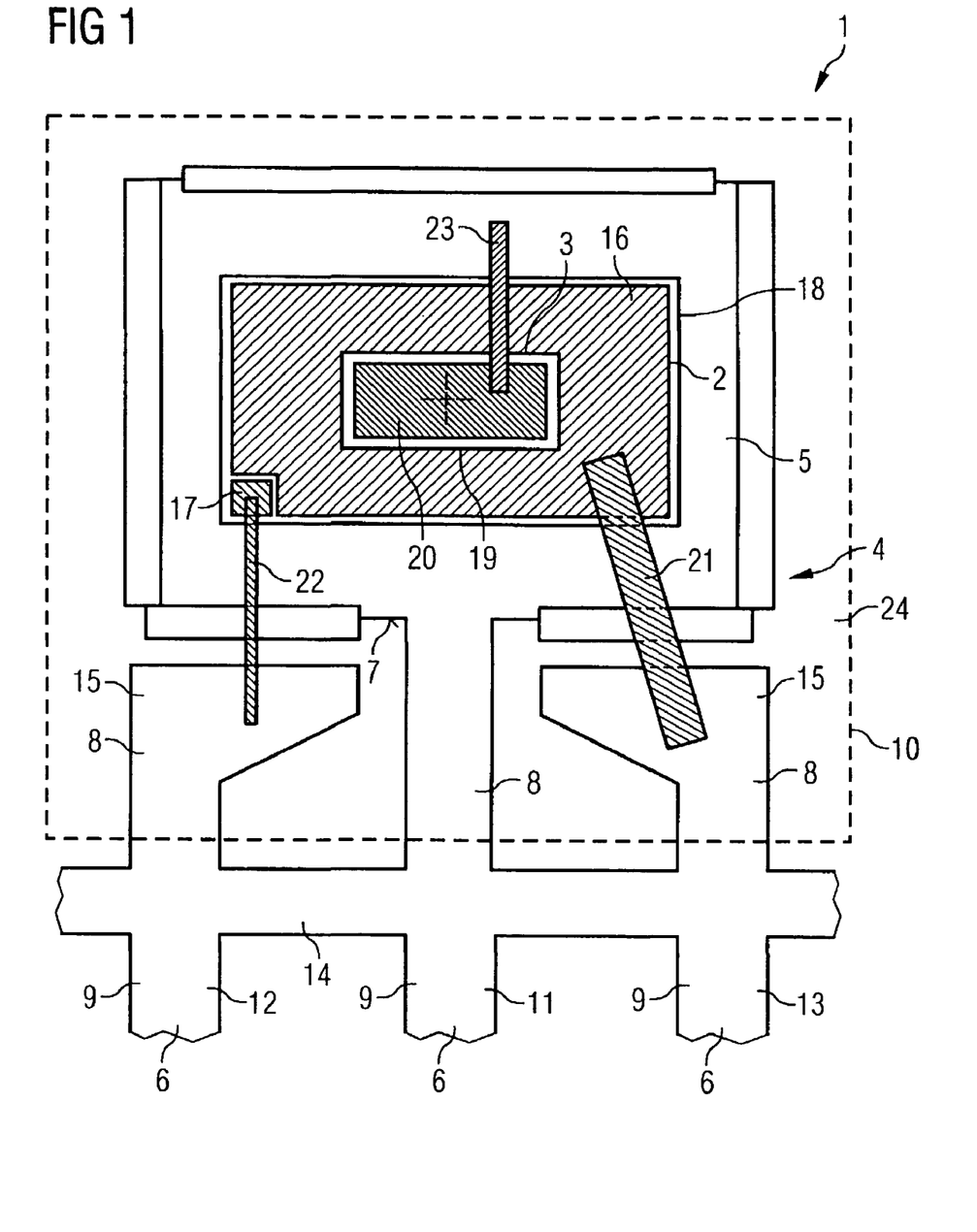
FIG. 1 shows a top plan view of an electronic module according to a first embodiment of the invention.

FIG. 1 shows an electronic module 1 according to a first embodiment of the invention which comprises a vertical MOSFET device 2, which provides a semiconductor power switch, and a vertical Schottky semiconductor diode 3. The electronic module 1 further comprises a leadframe 4 and package housing 10, which is indicated in FIG. 1 by the dashed line.

The leadframe 4 comprises a die pad 5, which is essentially rectangular, and three leads, or pins 6 which are arranged adjacent the long side 7 of the die pad 5. Each lead 6 has an inner portion 8, which is disposed within the package housing 10 and an outer portion 9 which is integral with the inner portion and extends outside of the package housing 10. The outer portion 9 of the leads 6 enables the electronic component 1 to be mounted on an external higher level substrate such as a printed circuit board (which is not shown in the figures) and enables the MOSFET device 2 and diode 3 to be electrically accessed from the printed circuit board.

The outer portion 9 of each of the three leads 6 extends in a direction which is essentially perpendicular to the long edge 7 of the rectangular die pad 5. Each lead 6 extends in a direction essentially parallel to each of the other leads 6 of the module 1.

The central lead 11 extends from, and is mechanically and electrically connected to, the die pad 5 and provides the drain lead 11 of the package 1. The lead 12 positioned to one side (the left in the orientation of the component shown in FIG. 1) of the drain lead 11 comprises the gate lead 12 of the component 1. The lead 13 positioned on the opposite side (on the right in the orientation of the component shown in FIG. 1) of the drain lead 11 comprises the source lead 13 of the electronic module 1.

The three leads 6 are joined by support bar 14 which is disposed approximately perpendicular to the three leads 10. The support bar 14 holds the leadframe 3 within a leadframe strip which comprises a plurality of essentially identical leadframes 3 arranged in rows and columns which are not shown in FIG. 1 for clarity. The support bar 14 is removed after the module assembly process is complete to electrically isolate the three leads 11, 12, and 13 and separate the module 1 from the leadframe strip.

The inner portion 8 of the gate lead 12 and the source lead 13 includes an inner bonding area or lead post 15. The inner contact areas 15 are positioned at a short distance from the edge of the die pad 3 and are, therefore, not directly mechanically attached to, or electrically connected to, the die pad 9.

The MOSFET device 2 is a vertical MOSFET device which comprises a source electrode 16 and a gate electrode 17 which are disposed on its upper surface and can be seen in the top view of the electronic module I shown in FIG. 1. The lower surface of the MOSFET device 2 comprises the drain electrode 18 which is not visible in the plan view of the electronic component 1 shown in FIG. 1. The MOSFET device 2 is mounted on the die pad 5 in approximately the lateral center by a solder bond which is also not visible in FIG. 1. The solder bond electrically connects the drain electrode 18 to the die pad 5 and, therefore, the drain lead 11 of the leadframe 4.

In the description of the figures "upper" is used to denote the side of the MOSFET device 2 and the side of the diode 3 that face away from the die pad 5. "Lower" is used to denote the side of the MOSFET device 2 and the side of the diode 3 which faces towards the die pad 5.

The diode 3 is mounted on, and electrically connected to, the upper surface of the MOSFET device 2. In this embodiment of the invention, the diode 3 is mounted on approximately the lateral center of the upper surface of the MOSFET device 2 and is electrically connected to the source electrode 16 of the MOSFET device 2 by a connection layer which will be described in more detail in conjunction with the side view of FIG. 2.

The vertical Schottky diode 3 has an upper surface and a lower surface. The lower surface comprises anode electrode 19, which is not visible in the top view of FIG. 1. The upper surface of the Schottky diode 3 comprises the cathode electrode 20.

The source electrode 16 of the MOSFET device 2 is electrically connected to the contact post 15 of the source lead 13 of the leadframe 4 by a bond wire 21. In this embodiment of the invention, the source electrode 16 is electrically connected by a single bond wire 21 to the contact post 15 of source lead 13. The bond wire 21 comprises aluminum and has a thickness of about 350 μm. However, two or more bond wires, each extending between the source electrode 16 and the contact post 15 of the source lead 13 are provided in an alternative embodiment, which is not shown in the figures.

The gate electrode 17 is electrically connected to the contact post 15 of the gate lead 12 of the leadframe 4 by a bond wire 22. The bond wire 22 comprises gold and has a diameter of approximately 75 μm.

The anode 19 of the diode 13 is electrically connected to the source electrode 16 of the MOSFET device 2 by an electrically conductive bond which will be described in conjunction with FIG. 2. The cathode electrode 20, which is disposed on the upper surface of the diode 3, is electrically connected to the die pad 5 by a bond wire 23 which extends between the cathode electrode 20 and the die pad 5. In a further embodiment of the invention, not shown in the figures, the cathode electrode 20 of the diode 3 is electrically connected by a plurality of bond wires 23, each of which extends between, and electrically connects, the cathode electrode 20 and the die pad 5. The cathode electrode 20 of the Schottky diode 3 is, therefore, electrically connected to the drain lead 11 of the leadframe 4 and the drain electrode 18 of the MOS- FET device 2. Therefore, the diode 3 is electrically connected in parallel with the MOSFET device 2 within the package housing 10 of the electronic module 1.

The MOSFET device 2, diode 3, bond wires 21, 22, 23, the die pad and inner portions 8 of the leads 6 including the contact posts 15 are encapsulated in epoxy resin 24 which provides the package housing 10. The outer contours of the package housing 10 in conjunction with the number, size and arrangement of the outer portions 9 of the leads 6 conform to a standard JEDEC package outline, in this embodiment a TO 251-3 package outline.

Figure 2:
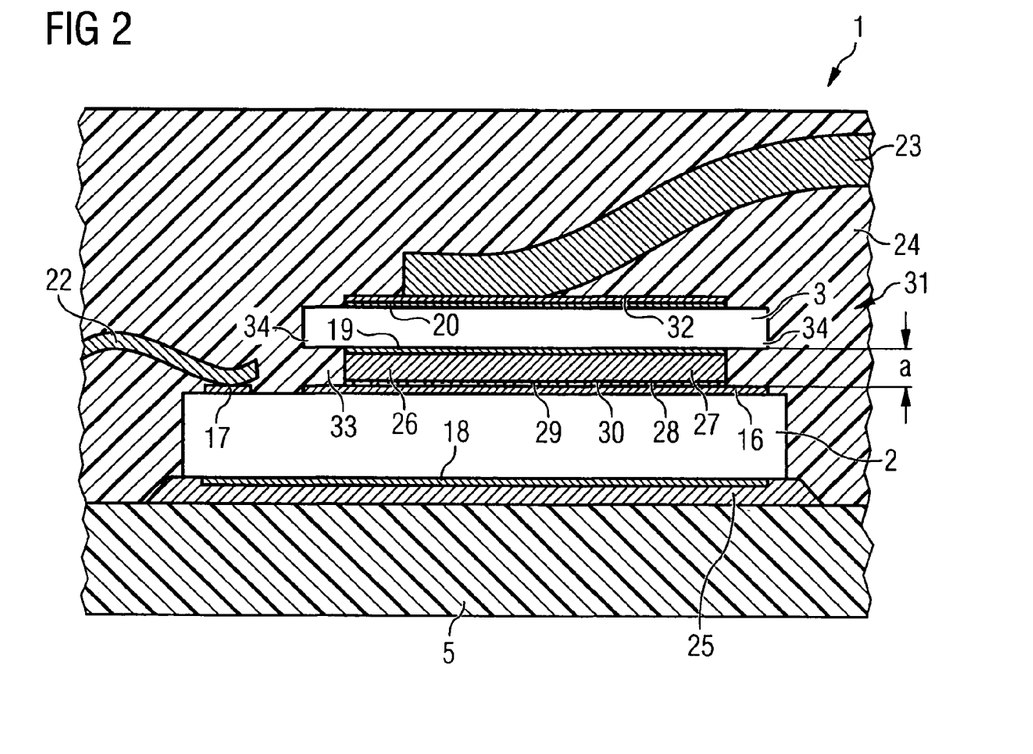
FIG. 2 shows a cross-sectional side view in elevation of the electronic module of FIG. 1.

FIG. 2 shows a cross-sectional side view of a section of the electronic component 1 of FIG. 1 and shows a portion of the die pad 5 on which the MOSFET device 2 and diode 3 are mounted.

As can be seen in this cross-sectional view, the MOSFET device 2 is mounted on, and electrically connected to, the die pad 5, and, consequently, electrically connected to the drain lead 11, by a layer of solder 25 which is disposed between the drain electrode 18 and the upper surface of the die pad 5. The MOSFET device 2 is attached to the die pad 5 of the leadframe 4 using a die attachment process in which solder 25 is dispensed onto the upper surface of the die pad 5, and the drain contact 18 of the MOSFET device 2 is pressed into the solder deposit.

The upper surface of the MOSFET device 2 includes the source electrode 16 and gate electrode 17 which face upwardly away from the die pad 5. The diode 3 is mounted on, and electrically connected to, the source electrode 16 of the MOSFET device 2 by an electrically conductive bond 26 which is disposed directly between the anode contact 19, which is disposed on the lower surface of the diode 3, and the source electrode 16 which is disposed on the upper surface of the MOSFET device 2. The electrically conductive bond 26 comprises a metallization 27 and diffusion bond 28. The metallization 27 is disposed directly on the anode electrode 19 of the diode 3. The metallization 27 is produced by galvanic deposition and has a thickness a, which in this embodiment of the invention, is about 50 μm.

The diode 3, including the metallization 27, is mounted on, and electrically connected to, the source electrode 16 using a diffusion soldering process. Therefore, the outer surface of the metallization 27, which is not in contact with the semiconductor body of the diode 3, comprises a further layer 29 which comprises a material which is able to form a diffusion solder bond with the material of the source electrode 16. During the diffusion bonding process, the diffusion solder layer 29 is transformed into intermetallic phases 30, which are formed from the material of the diffusion solder layer 29 and the material of the source electrode 16. The interface between the metal isolation 27 of the diode 3 and the source electrode 16 of the MOSFET device 2, therefore, includes the typical intermetallic phases of the diffusion solder bond. In this embodiment, the leadframe 4 comprises copper and the diffusion solder layer 29 comprises AuSn.

FIG. 2 illustrates that, in the electronic module 1 according to the first embodiment of the invention, the diode 3 is mounted on the MOSFET device 2 to form a stacked unit 31. The diode 3 is can be described as being mounted in a flip chip type arrangement as, in contrast to electronic modules in which the diode is mounted directly on the die pad 5 next to the MOSFET device 2, the cathode contact 20 of the diode 3 faces upwards away from the die pad 5 rather than being disposed on the die pad 5.

Therefore, in the electronic module 1 according to the invention, the cathode contact 20 is disposed on the upper surface of the diode 3 and is electrically connected to the die pad 5 by a bond wire 23 which extends between the cathode contact 20 and the die pad 5. Therefore, the cathode contact 20 is provided with an outer surface layer 32 which provides a surface which is suitable for wire bonding. This is in contrast to electronic modules in which the cathode contact of the diode is directly connected to the die pad by a solder bond. In this embodiment of the invention, the cathode contact 20 includes a layer 32 of silver which provides a suitable surface onto which the gold bond wire 23 can be reliably attached.

Also shown in the partial cross-sectional view of FIG. 2, is the gate electrode 17 which is positioned on the upper surface of the MOSFET device 2. The inner portion of the gold bond wire 22 which electrically connects the gate electrode 17 with the gate lead 12 of the leadframe 4 is also shown.

In order to provide an electronic module 1 with the stack 31 in which the diode 3 is electrically connected in parallel with the MOSFET device 2 within the package housing 10 of the electronic module 1, sufficient electrical isolation between the cathode contact 20 of the diode 3 and the source electrode 16 of the MOSFET device 2 is provided. According to the invention, this is provided by the epoxy resin 24 of the package housing 10.

The metallization 27, which is disposed on the anode contact 19 of the diode 3, has a thickness of about 50 μm and therefore provides an electrically conductive spacer which spaces the diode 3 at a distance of about 50 μm from the upper surface of the MOSFET device 2. The epoxy resin 24 which provides the plastic encapsulation material of the package housing 10 surrounds the metallization 27 and fills the space created between the diode 3 and MOSFET device 2.

The epoxy resin 24 provides an electrical isolation layer 33 between the edge regions 34 of the diode and the input contact 16 of the semiconductor power switch. The electrical isolation layer 33, therefore, has a thickness a, which in this embodiment of the invention, is about 50 mm. The thickness of the isolation layer 33 is varied by varying the thickness of the electrically conductive spacer 26. Epoxy resin has the advantage that it is highly electrically insulating so that it provides a blocking voltage of over a 1000 V between the cathode contact 20 and the source contact 16. This ensures a correctly functioning module.

Additionally, the semiconductor material of the body of the diode 3 is highly doped and, therefore, has a relatively high electrical conductivity. This can result in leakage currents in the edge regions 34 of the diode 3. These leakage currents are exacerbated by the relatively rough and imperfect side faces of the diode 3 caused by the sawing operation to separate the diode 3 from the semiconductor wafer in which it was produced. These leakage currents can produce short circuits between the diode 3 and the MOSFET device 2 which cause a deterioration in the functionality of the module. As the plastic encapsulation material 24 encapsulates the metallization 27, which provides a spacing between the diode and the MOSFET device 2, and encapsulates the edge regions and sides faces of the diode 3, the epoxy resin 24 is able to provide a sufficient electrical isolation between these edge regions 34 and the MOSFET device 2 so that short circuits are avoided.

Figure 3:
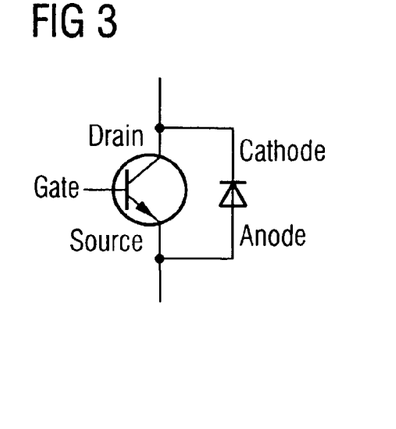
FIG. 3 shows a circuit diagram of the electronic module of FIGS. 1 and 2.

FIG. 3 shows a circuit diagram of the electronic module 1 shown in FIGS. 1 and 2. FIG. 3 illustrates that the diode 3 is electrically connected in parallel with the MOSFET device 2. The electronic module 1 provides a basic building block which can be used in numerous types of electronic circuitry. An example is shown in FIGS. 4 and 5.

Figure 4:
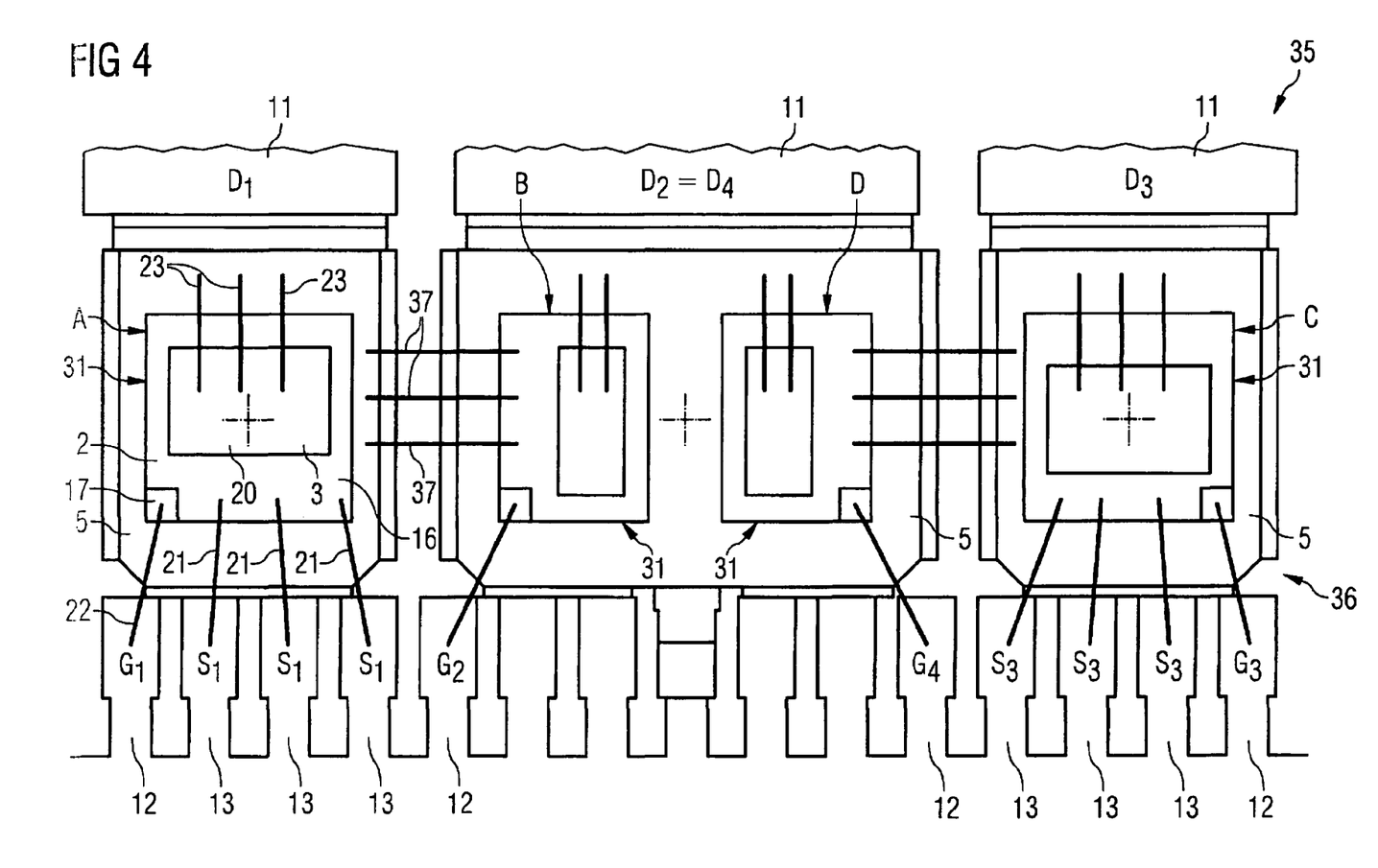
FIG. 4 depicts a plan view of an electronic module according to a second embodiment of the invention.
Figure 5:
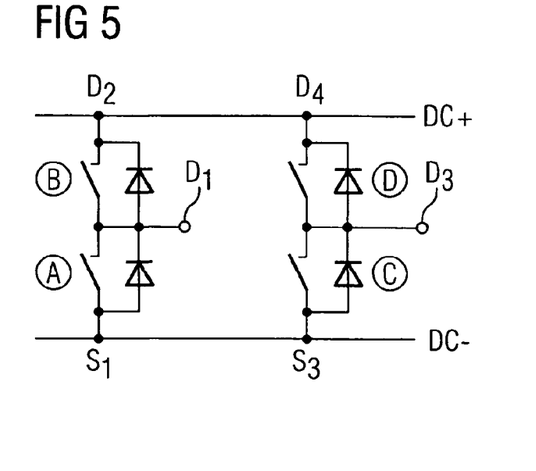
FIG. 5 shows a circuit diagram of the electronic module of FIG. 4.

FIG. 4 illustrates a top plan view of an electronic module 35 which includes four stacks 31, each including a MOSFET device 2 and Schottky diode 3, which are electrically connected to each other and the leadframe 36 of the module 35 to provide two half bridges which are in turn configured to provide a full-bridge. The electronic module 35 is suitable for controlling a dc electric motor. FIG. 5 shows the circuit diagram corresponding to the module 35 shown in FIG. 4.

As previously described, a stack 31 includes a MOSFET device 2 and a diode 3. The upper surface of the MOSFET device 2 includes a source electrode 16 and a gate electrode 17. The drain electrode 18 is disposed on the opposing lower surface and is mounted on, and electrically connected to, a die pad 5 of the leadframe 36.

A diode 3 is mounted on the upper surface of the MOSFET device 2. The anode contact 19 of the diode 3 the mechanically attached, and electrically connected to, the source electrode 16 of the MOSFET device 2 by a metallization 27 having a thickness such that the diode 3 is spaced form the MOSFET device 2. The cathode electrode 20 of the diode 3 therefore faces upwards away from the die pad 5. This arrangement provides one stack 31.

The electronic component 35 includes four stacks 31 labeled from left to right in the orientation of the module 35 shown in FIG. 4 as A, B, D and C. The leadframe 36 includes three die pads 5 arranged in a single row. The central die pad is laterally larger and accommodates to stacks 31, in particular the stacks B and D. The end die pads 5 each accommodate one stack 31. In the leadframe 36, the drain contacts 11 extend from one side of each of the die pads 5. The gate leads 12 and source leads 13 are located adjacent the opposing side of the die pads 5 and are not in mechanical or electrical contact with the die pads 5.

A half-bridge arrangement is provided by attaching a first (A) stack 31 to an end die pad 5 and a second stack 31 adjacent the first stack but mounted on the central die pad 5 of the leadframe 35. Similarly to the embodiment shown in FIG. 1, the first stack 31 is electrically connected to the leadframe 36 by a bond wire 22 extending between the gate electrode 17 and the gate lead 12 and by three bond wires 21, each extending between the source electrode 16 and one of three source leads 13. The anode contact 19 of the diode 3 is electrically connected to the source electrode 16 by the metallization 27 as previously described. The cathode electrode 20 is electrically connected to the die pad 5 by three bond wires 23. The end die pad 5, on which the first (A) stack 31 is mounted, is electrically connected to the source electrode 16 of the second (B) stack 31 by three bond wires 37. The gate electrode of the second stack 31 is electrically connected by a bond wire 22 to a gate lead 12. The cathode electrode 20 of the diode 3 of the second (B) stack 31 is electrically connected to the central die pad 5 by two bond wires 23. This arrangement provides a half-bridge.

A second half-bridge configuration is provided by the stack D, which is also mounted on the central die pad 5 and stack C which is mounted adjacent stack D but on the opposing end die pad 5. The arrangement of the bond wires mirrors that of the first half Bridge. Therefore, the electronic module 35 provides a full-bridge configuration suitable for controlling a dc electric motor.

An electronic module 1, 35 including at least one stack 31 may be assembled by the following method. A leadframe 4, 36 is provided which comprises at least one die pad 5 and a plurality of leads 6. The drain electrode 18 of a vertical MOSFET device 2 is mounted on, and electrically connected to, the upper surface of the die pad 5 by a die attachment process. A quantity of solder 25 is dispensed onto the die pad 5 at the position in which it is desired the MOSFET device 2 is located. The lower surface of the MOSFET device 2 including the drain electrode 18 is then pressed into the solder deposit.

A vertical diode 3 is provided which includes an anode contact 19 which comprises a metallization 27 which has a thickness which spaces the lower surface of the diode 3 from the source electrode 16 of the MOSFET 2 by a distance. A diffusion solder layer 29 is provided on an outer surface of the metallization 27 the cathode contact is provided with an additional wire bonding layer.

The diode 3 is mounted on, and electrically connected to, the source electrode 16 of the MOSFET to by a diffusion solder process. The diode 3 is pressed onto the surface of the source electrode 16 and at least the interface heated to a temperature such that intermetallic phases form between the diffusion bond layer 29 of the metallization 27 and the outer surface of the source electrode 16. Wire bond connections are then produced between the source electrode 16 and the source leads 13, the gate electrode 17 and the gate lead 12 and the cathode contact 20 of the diode 3 and the die pad 5. For an electronic module including a plurality of stacks 31, bond wires are provided between the stacks 31 and portions of the leadframe 36 so as to produce an electrical circuit with the desired function.

The MOSFET device 2, the diode 3, the bond wires 21, 22 and 23, the die pad 5 and inner portions 8 of the leads 6 are then encapsulated in epoxy resin 24. The outer surfaces of the epoxy resin provide the outer surfaces and outer contour of the package housing 10 of the electronic module 1, 35. The epoxy resin 24 which surrounds the metallization 27 and encapsulates the diode 3 and MOSFET device 2 provides sufficient electrical isolation between the diode 3 and MOSFET device 2 so as to ensure a correctly functioning module.

The electronic modules 1, 35 according to the invention may then be mounted on a higher-level the wiring board, such as a printed circuit board, in conjunction with other electronic components to provide a configuration which has a desired electrical function and performance.

Having described preferred embodiments of new and improved electronic module and method for assembling the same, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

REFERENCE NUMERALS 1 first electronic module
2 MOSFET device
3 diode
4 leadframe
5 die pad
6 leads
7 edge of die pad
8 portion of leads
9 outer portion of leads
10 package outline
11 drain lead or collector lead
12 gate lead
13 source lead or emitter lead
14 tie bar
15 contact post
16 source electrode or emitter electrode
17 gate electrode or collector electrode
18 drain electrode
19 anode contact 20 cathode contact
21 bond wire
22 bond wire
23 bond wire
24 epoxy resin
25 soft solder or diffusion solder
26 electrically conductive spacer
27 metallization
28 diffusion solder layer
29 diffusion bond
30 intermetallic phases
31 stack
32 wire bondable layer
33 isolation layer
34 edge regions
35 second electronic module
36 second leadframe
37 wire bond

What is claimed is:

1. An electronic module, comprising:
   a leadframe comprising a die pad and a plurality of leads, each lead having an inner portion and an outer portion, wherein at least one lead extends from the die pad providing an output lead, the remaining leads being spaced at a distance from the die pad and providing at least one input lead and a control lead;
   a semiconductor power switch comprising an upper side and a lower side, wherein the lower side of the semiconductor power switch is mounted on the die pad, a control contact and an input contact are disposed on the upper side of the semiconductor power switch, and an output contact is disposed on the lower side of the semiconductor power switch;
   a semiconductor diode comprising an upper side and a lower side, wherein the upper side comprises a cathode contact and the lower side comprises an anode contact, wherein the anode contact is disposed on and electrically connected to the input contact of the semiconductor power switch, and wherein the cathode contact is electrically connected to the output contact of the power semiconductor switch;
   at least one first electrical conductor extending between and electrically connecting the control contact of the semiconductor power switch and the control lead of the leadframe;
   at least one second electrical conductor extending between and electrically connecting the input contact of the semiconductor power switch and the input lead of the leadframe; and
   an electrically insulating plastic material encapsulating at least the semiconductor diode, the semiconductor power switch, the first and second electrical conductors, and the inner portions of the leads.

2. The electronic module of claim 1, wherein the anode contact lies at a distance from the input contact such that the plastic encapsulation material provides a voltage of between 500 V and 5000 V between the cathode contact of the semiconductor diode and the input contact of the semiconductor power switch.

3. The electronic module of claim 1, wherein the cathode contact further comprises a first bonding layer disposed on its surface.

4. The electronic module of claim 3, wherein the first bonding layer comprises at least one of Ag, Ni, and NiP.

5. The electronic module of claim 1, wherein the anode contact of the diode further comprises a second bonding layer disposed on its surface.

6. The electronic module of claim 5, wherein the second bonding layer comprises one of AuSn, AgSn, and CuSn.

7. The electronic module of claim 1, wherein the anode contact of the semiconductor diode is mechanically and electrically connected to the input contact of the semiconductor power switch by one of soft solder, electrically conductive adhesive, and diffusion solder.

8. The electronic module of claim 1, wherein an electrically conductive spacer is disposed on the anode contact of the semiconductor diode, the electrically conducting spacer providing a spacing between the anode contact and the input contact of the semiconductor power switch.

9. The electronic module of claim 8, wherein the electrically conductive spacer further comprises a third bonding layer.

10. The electronic module of claim 9, wherein the third bonding layer comprises one of AgSn, AuSn, and CuSn.

11. The electronic module of claim 8, wherein the electrically conductive spacer has a thickness of about 50 µm.

12. The electronic module of claim 8, wherein the electrically conductive spacer is laterally smaller than the anode contact of the semiconductor diode so that edge regions of the anode remain free from the electrically conductive spacer and are spaced at a distance from the input of the semiconductor power switch and are covered by the plastic encapsulation material.

13. The electronic module of claim 8, wherein the electrically conductive spacer is mechanically and electrically connected to the input contact of the semiconductor power switch by one of soft solder, electrically conductive adhesive, and diffusion solder.

14. The electronic module of claim 8, wherein the electrically conductive spacer comprises at least one of copper, nickel, and aluminum.

15. The electronic module of claim 1, wherein the first electrical conductor comprises one of a bond wire and a clip, and the second electrical conductor comprises one of a bond wire and a clip.

16. The electronic module of claim 1, wherein the cathode contact of the semiconductor diode is electrically connected to the output lead of the leadframe by one of a bond wire and a clip.

17. The electronic module of claim 1, wherein the semiconductor power switch is a MOSFET, and the input contact is a source electrode, the output contact is a drain electrode, and the control contact is a gate electrode.

18. The electronic module of claim 1, wherein the semiconductor power switch is a bipolar junction transistor (BJT), the input contact is an emitter electrode, the output contact is a collector electrode, and the control contact is a base electrode.

19. The electronic module of claim 1, wherein the semiconductor power switch is an insulated gate bipolar transistor (IGBT), the input contact is an emitter electrode, the output contact is a collector electrode, and the control contact is a gate electrode.

20. The electronic module of claim 1, wherein the semiconductor diode is one of a Schottky diode and a pin diode.

21. The electronic module of claim 1, wherein the semiconductor diode is electrically connected in parallel with the semiconductor power switch.

22. The electronic module of claim 1, wherein the semiconductor diode is a free-wheeling diode.

23. The electronic module of claim 1, wherein the electronic module has a package outline conforming to a JEDEC (Joint Electron Device Engineering Council) standard package outline.

24. The electronic module of claim 1, wherein the electronic module comprises a plurality of semiconductor power switches and semiconductor diodes.

25. The electronic module of claim 24, wherein the plurality of semiconductor power switches and the plurality of diodes are arranged to provide a plurality of stacks, each stack comprising a diode and a semiconductor power switch, wherein the anode contact of the diode is mounted on and electrically connected to the input contact of the semiconductor power switch, and wherein the electronic module comprises a circuit having a half-bridge arrangement including two stacks or a full-bridge arrangement including four stacks.

26. An electronic module, comprising:
a semiconductor power switch comprising an upper side and a lower side, wherein a control contact and an input source contact are disposed on the upper side of the semiconductor power switch, and wherein an output contact is disposed on the lower side of the semiconductor power switch;
a semiconductor diode comprising an upper side and a lower side, wherein the upper side comprises a cathode contact and the lower side comprises an anode contact, wherein the anode contact is disposed on and electrically connected to the input contact of the semiconductor power switch; and
an electrically insulating plastic material encapsulating the semiconductor diode and the semiconductor power switch;
wherein the semiconductor diode is electrically connected in parallel with the semiconductor power switch, and wherein the electrically insulating plastic material provides a voltage of between about 500 V and 5000 V between the cathode contact of the semiconductor diode and the input contact of the semiconductor power switch.

27. An electronic module, comprising:
a plurality of semiconductor power switches and semiconductor diodes arranged to provide a plurality of stacks, each stack including a semiconductor power switch and a semiconductor diode, wherein:
the semiconductor power switch comprises an upper side and a lower side, a control contact and an input contact are disposed on the upper side of the semiconductor power switch, and an output contact is disposed on the lower side of the semiconductor power switch;
the semiconductor diode comprises an upper side and a lower side, the upper side comprises a cathode contact and the lower side comprises an anode contact;
in each stack, the anode contact of the semiconductor diode is disposed on and electrically connected to the input contact of the semiconductor power switch; and
the plurality of semiconductor power switches and the plurality of semiconductor diodes are configured in an electronic circuit.

28. The electronic module of claim 27, wherein the electronic module consists of four stacks configured in a full-bridge arrangement.

29. A method of assembling an electronic module, comprising:
providing a leadframe comprising a die pad and a plurality of leads, each lead having an inner portion and an outer portion, wherein at least one lead extends from the die pad providing an output lead, the remaining leads being spaced at a distance from the die pad and providing at least one input lead and a control lead;
providing at least one semiconductor power switch comprising an upper side and a lower side, wherein a control contact and an input contact are disposed on the upper side of the semiconductor power switch and an output contact is disposed on the lower side of the semiconductor power switch;
attaching the lower side of the semiconductor power switch to the die pad;
providing a semiconductor diode comprising an upper side and a lower side, wherein the upper side comprises a cathode contact and the lower side comprises an anode contact;
mounting the diode on the semiconductor power switch by mounting and electrically connecting the anode contact to the input contact of the semiconductor power switch;
electrically connecting the cathode contact of the semiconductor diode to the output lead;
electrically connecting the control contact of the semiconductor power switch to the control lead of the leadframe;
electrically connecting the input contact of the semiconductor power switch to the input lead; and
encapsulating at least the semiconductor diode and the semiconductor power switch in electrically insulating plastic material.

30. The method of assembling an electronic module of claim 29, wherein the anode of the semiconductor diode further comprises an electrically conductive spacer providing a spacing between the anode contact and the input contact of the semiconductor switch.

31. The method of assembling an electronic module of claim 30, wherein the electrically conductive spacer is laterally smaller than the anode of the semiconductor diode so that edge regions of the anode remain free from the electrically conductive contact and are spaced at a distance from the input of the semiconductor switch and are covered by the plastic encapsulation material.

32. A method of assembling an electronic module, comprising:
providing at least one semiconductor power switch comprising an upper side and a lower side, wherein a control contact and an input contact are disposed on the upper side of the semiconductor power switch, and an output contact is disposed on the lower side of the semiconductor power switch;
providing at least one semiconductor diode comprising an upper side and a lower side, wherein the upper side comprises a cathode contact and the lower side comprises an anode contact;
mounting the semiconductor diode on the semiconductor power switch by mounting and electrically connecting the anode contact to the input contact of the semiconductor power switch; and
providing electrical isolation between the cathode contact of the semiconductor diode and the input contact of the semiconductor power switch to provide a voltage of between 500 V and 5000 V between the cathode contact of the semiconductor diode and the input contact of the semiconductor power switch.

33. The method of assembling an electronic module of claim 32, wherein the anode of the semiconductor diode further comprises an electrically conductive spacer providing a spacing between the anode contact and the input contact of the semiconductor switch.

34. The method of assembling an electronic module of claim 32, wherein a plurality of semiconductor power switches and a plurality of diodes are arranged to provide a plurality of stacks, each stack comprising a diode and a semiconductor power switch, wherein the anode contact of the diode is mounted on and electrically connected to the input contact of the semiconductor power switch, and wherein the stacks are electrically connected to provide a circuit having a half-bridge arrangement comprising two stacks or a full-bridge arrangement comprising four stacks.

* * * * *